United States Patent [19]

Vorst

[11] Patent Number: 4,620,291
[45] Date of Patent: Oct. 28, 1986

[54] DIGITAL-TO-ANALOG CONVERTER INTERPOLATOR

[75] Inventor: Carl J. Vorst, St. Louis County, Mo.

[73] Assignee: McDonnell Douglas Corporation, St. Louis, Mo.

[21] Appl. No.: 577,561

[22] Filed: Feb. 6, 1984

[51] Int. Cl.⁴ .................. G06J 1/00; H03K 6/00; H03K 4/08; H03K 3/00
[52] U.S. Cl. .................. 364/607; 364/608; 364/852; 364/853; 328/19; 307/106
[58] Field of Search ............. 364/607, 608, 852, 853; 328/19; 307/106

[56] References Cited

U.S. PATENT DOCUMENTS

| | | | |
|---|---|---|---|
| 2,908,873 | 10/1959 | Bogert | 333/18 |
| 2,982,852 | 5/1961 | Fano | 250/6 |
| 3,183,448 | 5/1965 | Strother et al. | 329/107 |
| 3,234,545 | 2/1966 | James et al. | 340/347 |
| 3,317,845 | 5/1967 | Terp | 328/165 |
| 3,500,213 | 3/1970 | Ameau | 328/14 |
| 3,543,009 | 11/1970 | Voelcker | 235/150.4 |
| 3,557,347 | 1/1971 | Robertson | 364/608 |
| 3,659,207 | 4/1972 | Perreault | 328/14 |
| 3,757,041 | 9/1973 | Thorpe et al. | 178/7.2 |
| 3,772,681 | 11/1973 | Skingle | 340/347 |
| 3,775,770 | 11/1973 | Dillard et al. | 343/378 |
| 3,852,640 | 12/1974 | McCarthy | 315/276 |
| 3,876,888 | 4/1975 | Gyugyi et al. | 307/261 |
| 3,971,923 | 7/1976 | Linder | 235/150.53 |
| 4,105,958 | 8/1978 | Pierce et al. | 333/29 |
| 4,170,766 | 10/1979 | Pridhan et al. | 367/135 |
| 4,207,772 | 6/1980 | Stoller | 328/14 X |
| 4,213,185 | 7/1980 | Muri et al. | 328/14 X |
| 4,464,727 | 8/1984 | Parkes et al. | 364/852 X |
| 4,504,741 | 3/1985 | Armitage | 328/14 X |

FOREIGN PATENT DOCUMENTS

| | | |
|---|---|---|
| 1404768 | 3/1975 | United Kingdom . |
| 1461220 | 1/1977 | United Kingdom ............ 328/14 |
| SU076820 | 9/1980 | U.S.S.R. ......................... 364/607 |

OTHER PUBLICATIONS

Analog Function Generation Using ROM's, Link (Texas Instruments GB), Apr. 1974.

Primary Examiner—Jerry Smith
Assistant Examiner—Charles B. Meyer
Attorney, Agent, or Firm—Polster, Polster and Lucchesi

[57] ABSTRACT

A digital-to-analog converter interpolator is provided finding application, among others, as a digital ramp smoother. In the preferred embodiment, a regular input step digital ramp signal f(t) is provided as an input signal to a delay line. The delay line is selected so as to have a total delay length equal to an input update period (T) of concern. The output side of the delay line also is adjustable. The delay line voltage output is sampled at intervals of T divided by N over the length of the delay line, where N may be selected to give the desired precision. The sample voltages are summed in a suitable device, and each are given an equal weight of 1/N. The resultant output is a smooth wave form. Structure also is provided for adjusting the gain of the summing device.

13 Claims, 2 Drawing Figures

DIGITAL-TO-ANALOG CONVERTER INTERPOLATOR

BACKGROUND OF THE INVENTION

This invention relates to calligraphic image generation finding particular application in aircraft flight simulators. While the invention is described with particular emphasis on its flight simulator application aspects, those skilled in the art will recognize the wider applicability of the inventive principles disclosed hereinafter.

Flight simulators are well known in the art. A device with which the present invention is particularly well adapted for use is shown and described in U.S. Pat. No. 3,996,673 to Carl J. Vorst et al, issued Dec. 14, 1976, the disclosure of which is specifically incorporated by reference herein. As discussed in U.S. Pat. No. 3,996,673, it is generally advantageous to perform computations using digital techniques. The advantages of digital processing are well recognized in the art, and are not discussed in detail. It is sufficient here to note that digital computations simplify hardware. Such hardware has become increasingly cost competitive with corresponding analog methods for accomplishing similar objectives. A major problem with digital processing in calligraphic image generation, however, is that encountered in converting the digital signal accurately back to a smooth analog wave form required for data presentation on a CRT, for example. Digital-to-analog converters are step output devices. If the output wave form rate of change is slow enough, the step size can be made insignificant by using a high conversion rate. If the rate of change is high, however, minimum step size becomes limited by maximum digital-to-analog converter update rate.

Present devices for smoothing digital-to-analog conversion steps involve either low pass filtering or passing the output of the digital-to-analog device through a notch filter having a center frequency the same as that of conversion. In general, these devices result in a non-linear response to a step input, which is not a desirable output if the intended use of the output is a continuous ramp. Certain prior art also is known which utilize for other purposes certain structural features found in the present invention. For example, U.S. Pat. No. 3,543,009 to Voelcker, issued Nov. 24, 1970, shows, in FIG. 2, an analog transversal filter (AFT). The filter includes a tapped delay line with an analog summation of the tap outputs. As recognized in the '009 patent, complicated analog LTI filters are essentially fixed rate wave form generators. If one wants to change the signalling rate significantly, i.e., to scale in time, it is often cheaper to provide new filters rather than to incorporate adjustment features. The '009 patent approached the solution to this problem by utilizing shift registers in which the input pulse units are shifted through the stages of the shift register at a rate faster than the fastest rate of occurrence of such pulse units. My invention, on the other hand, overcomes the shortcomings of prior art ATF's, by incorporating means for varying the effective sampling rate of the device. Consequently, I can employ more conventional delay lines compatible, for example, with the image generating device disclosed in the above-referenced Vorst U.S. Pat. No. 3,996,673.

U.S. Pat. No. 3,317,845 to Terp, issued May 2, 1967, employs a tapped delay line as part of a matched filter. The filter is designed to pass low level signals effected only by the characteristic response of the delay line. If the signal input exceeds some threshold level, the output is gated off for a period equal to one half of the expected input pulse width, then momentarily gated on, then off again. The circuit operates to convert a radar pulse and its sideband reflections to a single pulse. The delay line is used as a timing device for gate control in filter operation.

As disclosed hereinafter, a tapped delay line is utilized with a summing network as part of my invention. However, the invention makes use of gates to control the period of time in which the input signal is summed. The time period is matched to the update rate of a digital input signal. Means also are included to varying summing gain of the interpolator of this invention.

The invention disclosed hereinafter has the advantage of producing a linear ramp output, given a step input. If the digital data updates are spaced by a time period T, the interpolator may be configured to produce a continuous ramp output.

One of the objects of this invention is to provide a device for providing a continuous output wave from a stepped input wave.

Another object of this invention is to provide a low cost device for providing a continuous output wave from a stepped input wave.

Another object of this invention is to provide a device for controlling the period of time in which the input signal is summed.

Another object of this invention is to provide a device in which the time period in which the input signal is summed is matched to the update rate of a digital signal input to the device.

Another object of this invention is to provide a device which may accommodate a varying input signal update rate by controlling the number of gates activated from the delay line along with varying the summing gain of a summing device.

Other objects of this invention will be apparent to those skilled in the art in light of the following description and accompanying drawings.

SUMMARY OF THE INVENTION

In accordance with this invention, generally stated, an interpolator is provided which operates by taking a real time average over time period (t) to (t and T). An incremental analog ramp voltage updated at $t=0$, T, 2T, ... mT, forms an input to a delay line with a delay length T. The delay line voltage is sampled at equal subintervals along its length. The samples are summed to provide a smoothed ramp voltage output. The period T over which summing occurs, as well as the gain of the summing device, are electronically variable to accommodate a multiplicity of input update rates.

DESCRIPTION OF THE PREFERRED EMBODIMENT

Figure 1:
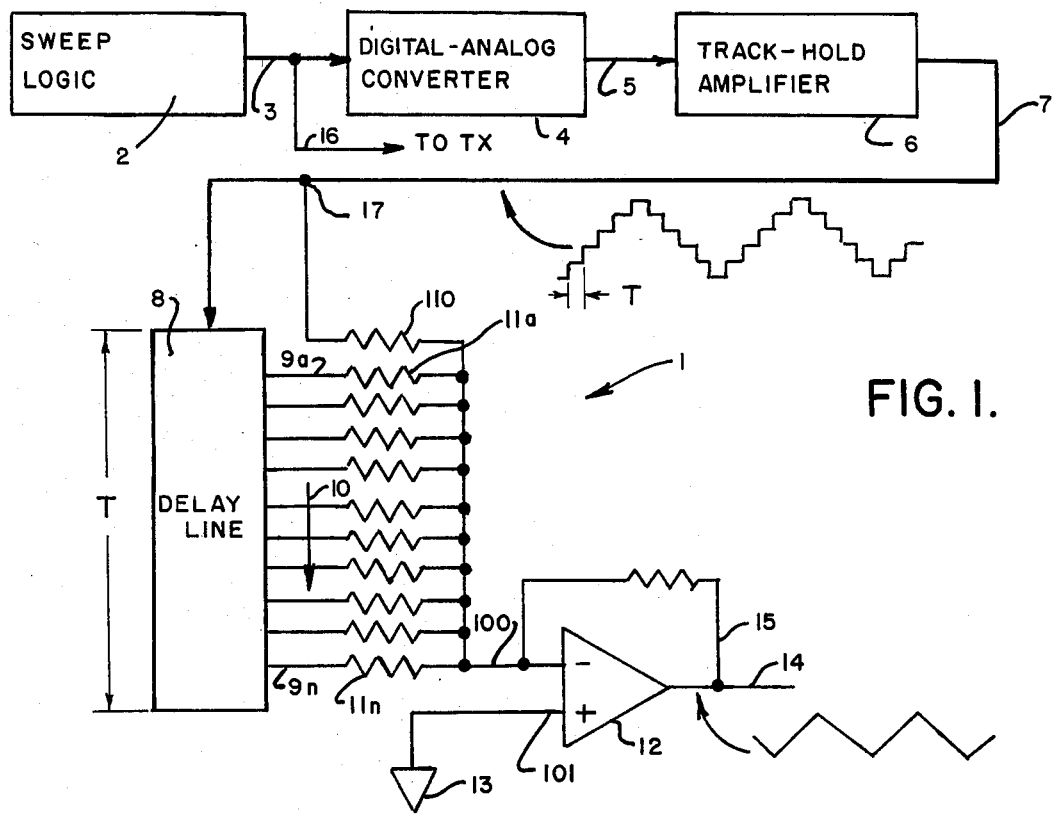
FIG. 1 is a simplified block diagrammatic view showing the operation of one illustrative embodiment of interpolator of this invention.

Referring now to the FIG. 1, reference numeral 1 indicates one illustrative embodiment of interpolator of this invention. The interpolator 1 finds application with devices providing an incremental input voltage, and operates to provide a smooth voltage at an output side. In general, a digital sweep input is obtained from a suitable sweep logic means 2 having an output side 3 operatively connected to a digital-to-analog converter 4. An output side 5 of the digital-to-analog converter 4 forms an input to an amplifier 6 which has an output 7 operatively connected to a delay line 8. The output side 7 of the amplifier 6 is illustrated in FIG. 1 as an incremental input ramp voltage having an update period T.

The delay line 8 parameters are chosen so that the maximum delay of the delay line corresponds to the maximum update period T for the ramp voltage wave appearing at the output 7 of the amplifier 6. The delay line 8 has a plurality of tapped outputs 9a through 9n. Those skilled in the art will recognize that the number of tapped outputs for the delay line 8 may be varied in other embodiments of this invention. The various outputs 9a through 9n are selectively energizable, as later described in detail. It is here noted that the control of the tapped outputs is indicated by the control arrow 10 shown in FIG. 1. The tapped outputs 9a through 9n of the delay line 8 pass through suitable resistors 11a through 11n. The output sides of the resistors 11a through 11n and the output side of a resistor 110 are electrically connected to one another and to the negative input 100 of a summing amplifier 12. A positive input 101 of the amplifier 12 is electrically connected to ground as illustratively shown at 13. The amplifier 12 has an output 14. A feedback loop 15 is connected between the output 14 and the input 100 of the amplifier 12. The circuit shown in FIG. 1 operates to provide a smooth wave form at the output 14 of the amplifier 12 from the stepped input digital sweep voltage at the output 7 of the amplifier 6.

As shown in FIG. 1, the output 3 of the sweep logic means 2 also forms an input at 16, the purpose of which is later described in greater detail.

The resistor 110 also is connected to the output 7 of the amplifier 6 at a connection node 17. The circuit just described is an electrical representation of the following:

If F(iT) is a discrete sequence representing the sweep logic output then f(t)=f(iT), where (iT) is less than or equal to t is less than or equal to (i+1) T, where i=0, 1, 2 . . . . Then $$F(t) = \frac{1}{N} \sum_{k=o}^{N-1} f\left(t - \frac{T}{N} K\right),$$

where N equals the number of summing resistors.

The interpolator 1 operates by taking a real time average over a sliding, fixed length time interval. FIG. 1 essentially shows the configuration of the basic interpolator and its application as a digital ramp smoother. A regular input stepped digital ramp f(t) is provided as an input to the delay line 8, with a total delay length equal to the input update period T. The delay line 8 voltage is sampled at intervals of T/N over its length where N may be selected to give the desired precision. The samples are summed, each given an equal weight of 1/N with the result being a smooth wave form F(t). The output F(t) is a linear interpolation of the input f(t).

Figure 2:
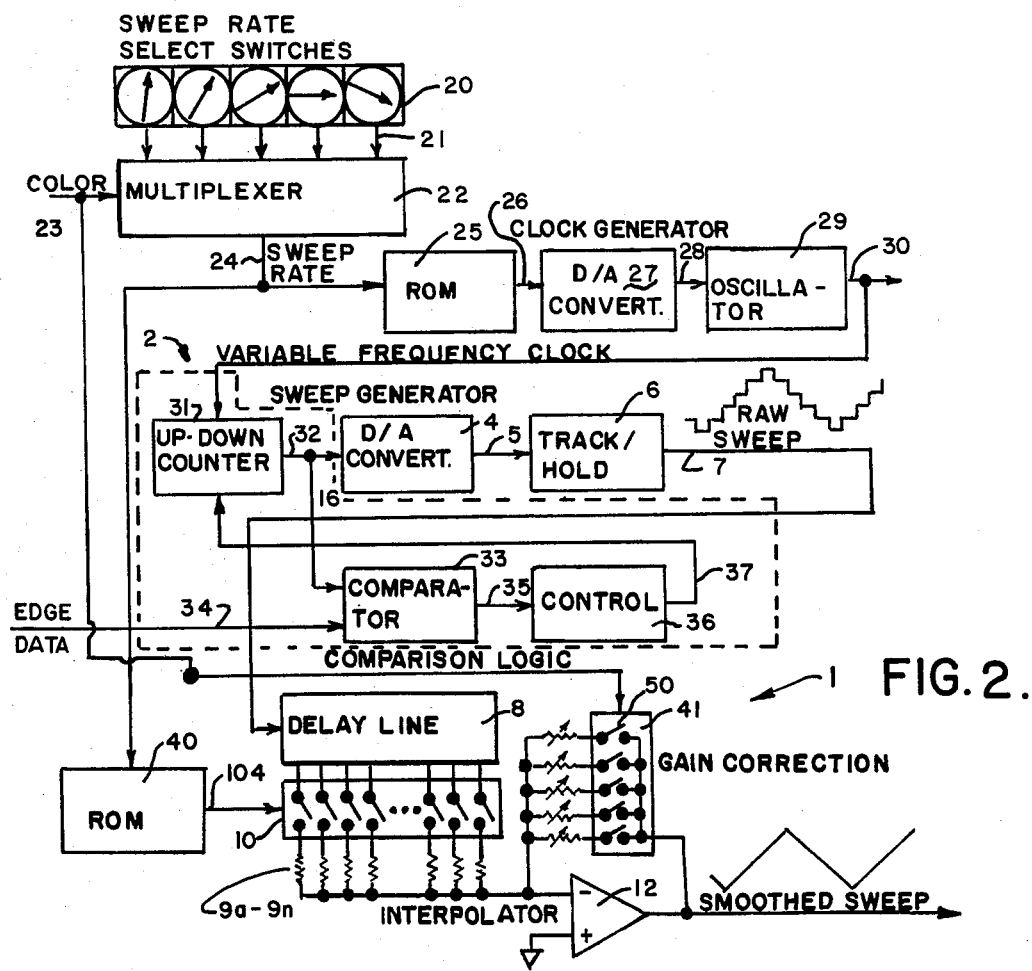
FIG. 2 is a more detailed block diagrammatic view showing the use of the interpolator of FIG. 1 incorporated in a image generating system as disclosed, for example, in U.S. Pat. No. 3,996,673.

FIG. 2 shows the incorporation of the interpolator 1 into a calligraphic image generator, like numerals being employed for like components in the respective views, where appropriate. A plurality of sweep rate select switches 20 have output sides 21 operatively connected to a multiplexer 22. The individual, switch adjustable sweep rates are selected as a function of an externally supplied display color signal electrically connected to the multiplexer 22 at an input 23. When used in conjunction with a calligraphic image generator, the digital-to-analog converter interpolator of this invention is used in a graphic device incorporating a pentron type cathode ray tube for image display. Such a tube has the color of its presentation controlled by varying the anode voltage, which in turn varies the amount of deflection power required to achieve a particular sweep rate. The color signal is used to adjust the sweep speed to compensate for display power restriction. Those skilled in the art will recognize that the "color" signal at input 23 can be replaced by any other signal which would denote the requirement for the sweep generator to operate at a particular speed.

An output side 24 of the multiplexer 22 provides a sweep rate signal to a read only memory (ROM) 25. The ROM 25 is programmed so that its output 26 is expressed as frequency. The frequency output of the ROM 25 forms an input to a digital-to-analog converter 27 having an output side 28 forming an input to a voltage control oscillator 29. An output side 30 of the voltage control oscillator 29 forms an input to the sweep generator logic means 2, which includes an up-down counter 31. The up-down counter 31 has an output 32 forming an input to the digital-to-analog converter 4. As indicated above, the output 5 of the digital-to-analog converter 4 is an input to a track and hold amplifier 6. The track and hold amplifier 6 functions to remove any spikes that might be present in the input wave form, and provides the stepped sweep voltage at its output side 7. The output 7 of the amplifier 6 is an input to the delay line 8. The signal at 16 from the counter 31 is an input to a comparator 33. The comparator 33 compares the position of the up/down counter with that of the raster edge data provided along an input 34. The comparator 33 has an output side 35 forming an input to a control means 36. The control means 36 reverses the up/down counter 31 along an output 37 whenever the control means 36 is activated by the comparator 33.

The sweep rate at the output 24 of the multiplexer 22 also is provided directly to a read only memory (ROM) 40 and to a gain correction means 41. The sweep rate is used at the ROM 40 to select a sample period for delay line averaging corresponding to the clock period by activating any one of a plurality of the switches 10 along an output 104 of the ROM 40. The display color signal at 23 is also connected to the gain correction means 41. The gain correction means 41 operates to select one of a plurality of switches 50, enabling the amplifier 12 to provide the appropriate gain correction to maintain constant gain on a suitable video display device, not shown.

As indicated, FIG. 2 shows the interpolator 1 configured for use in the sweep generating means disclosed in the above-referenced U.S. Pat. No. 3,996,673. In the application of which U.S. Pat. No. 3,996,673 is illustrative, there is a need to accommodate variable sweep update rates and to change sweep direction as a function of externally supplied edge boundary data. Individual, switch adjustable sweep rates are selected as a function of an externally supplied display color signal. The sweep rate at output 24 is supplied to the ROM 25 which has an output expressed as frequency. The frequency output is fed to a digital-to-analog converter 27, the output of which is an input to a voltage controlled oscillator 29. The output of the oscillator 29 is a variable clock frequency supplied to the sweep generator. The sweep rate signal also is supplied directly to the interpolator 1 through the ROM 40. Sweep rate is used in the interpolator 1 to select a sample period for delay line 8 averaging corresponding to the clock period of the sweep rate. The display color is used to select the appropriate gain correction in the gain correction means 41 to maintain constant gain at the display.

As thus described, it will be apparent that the interpolator 1 meets all the ends and objects set forth hereinabove.

Numerous variations, within the scope of the appended claims, will be apparent to those skilled in the art in light of the foregoing description and accompanying drawings. Thus, while the device was described primarily in its use as in calligraphic displays, those skilled in the art will recognize the wider applicability of the invention. For example, the interpolator 1 may be used in the smoothing of digitized video or audio signals, for the smoothing of digitally generating analog functions (e.g., precision wave form generators), or for remote generation of precision high speed analog wave forms. As will be appreciated by those skilled in the art, adaption of the device may be made for edge smoothing of computer graphic surfaces and lines. While linear interpolation was described, other than linear interpolation may be performed by using non-uniform sample intervals or summing resistor values. Simplified block diagrammatic views and single line representations were employed to facilitate description of the invention. Those skilled in the art will recognize that the single line representations of the drawings are in fact multiple line connections in hardware embodiments of this invention. These variations are merely illustrative.

Having thus described the invention, what is claimed and desired to be secured by Letters Patent is:

1. A digital interpolator device, comprising:
   means for generating an electrical signal representation of a digital ramp voltage;
   digital-to-analog converter means operatively connected to an output side of said generating means, said digital-to-analog converter providing an analog stepped voltage form at its output side;
   an analog delay line having an input side operatively connected to the output side of said digital-to-analog converter means, said analog delay line having a plurality of output taps;
   means for summing the electrical signal representation at the output taps of said analog delay line;
   means for selecting a sample period for said delay line operatively connected between said signal generating means and said output taps;
   means for controlling the gain of said summing means operatively connected between an output side and an input side of said summing means; and
   means for adjusting sweep rates operatively connected to said means for selecting a sample period for said delay line including a first read only memory operatively connected between said sweep selecting means, and a voltage controlled oscillator operatively connected to said first read only memory and to said digital-to-analog converter.

2. The device of claim 1 further including an up-down counter operatively connected between said voltage controlled oscillator and said digital-to-analog converter.

3. The device of claim 2 further including a comparator for determining a control signal for reversing said up-down counter, said comparator being operatively connected between the output side of said up-down counter and a control means, and a control means generating an electrical signal in response to the comparison of said comparator for reversing said up-down counter.

4. The device of claim 3 wherein said means for selecting a sample period for said delay line comprises a second read-only memory operative to control a plurality of switches electrically connected to the output taps of said delay line.

5. A digital interpolator device, comprising:
   means for generating an electrical signal representation of a digital ramp voltage;
   digital-to-analog converter means operatively connected to the electrical signal generating means at the output side of said generating means, said digital-to-analog converter providing an analog stepped wave form at its output side;
   an analog delay line having an input side operatively connected to the output side of said digital-to-analog converter, said analog delay line having a plurality of output taps;
   means for summing the electrical signal representation at the output taps of said analog delay line;
   means for controlling the gain of said summing means operatively connected between an output side of said summing means and an input side of said summing means;
   means for selecting a sample period for said delay line operatively connected between said signal generating means and the output taps of said delay line;
   means for adjusting sweep rates operatively connected to said means for selecting a sample period for said delay lines;
   a read only memory operatively connected between said sweep collecting means and a voltage control oscillator; and
   said voltage controlled oscillator operatively connected to said read only memory means and said digital-to-analog converter.

6. The device of claim 5 further including an up-down counter operatively connected between said voltage controlled oscillator and said digital-to-analog converter.

7. The device of claim 6 further including a comparator for determining a control signal for reversing said up-down counter, said comparator being operatively connected between the output side of said up-down counter and a control means, said control means generating an electrical signal in response to the comparison of said comparator for reversing said up-down counter.

8. The device of claim 7 wherein said means for selecting a sample period for said delay line comprises a second read-only memory operative to control a plurality of switches electrically connected to the output taps of said delay line.

9. A digital interpolator device, comprising:
   means for generating an electrical signal representation of a digital ramp voltage;
   digital-to-analog converter means operatively connected to said generating means at its output side, said digital-to-analog converter providing an analog stepped wave form at its output side;

an analog delay line having an input side operatively connected to the output side of said digital-to-analog converter, said analog delay line having a plurality of output taps;

means for summing the electrical signal representation at the output taps of said analog delay line; and means for selecting a sample period for said delay line operatively connected between said signal generating means and said output taps, said sample period selecting means including a read-only memory operatively connected between said signal generating means, and a plurality of electronically switchable devices operatively controlled by said read-only memory means and electrically connected to the output taps of said delay line.

10. The device of claim 9 further including means for controlling the gain of said summing means operatively connected between the output side and an input side of said summing means.

11. The device of claim 10 further including means for adjusting sweep rates operatively connected to said means for selecting a sample period for said delay line, and a second read-only memory operatively connected between said sweep selecting means and a voltage controlled oscillator.

12. The device of claim 11 further including an up-down counter operatively connected between said voltage controlled oscillator and said digital-to-analog converter.

13. The device of claim 12 further including a comparator for determining a control signal for reversing said up-down counter, said comparator being operatively connected between the output side of said up-down counter and a control means, said control means generating an electrical signal in response to the comparison of said comparator for reversing said up-down counter.

* * * * *